(12) United States Patent
Zambrano

(10) Patent No.: US 6,420,765 B1
(45) Date of Patent: Jul. 16, 2002

(54) ROM MEMORY CELL NOT DECODABLE BY VISUAL INSPECTION

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/875,448

(22) Filed: Jun. 5, 2001

(30) Foreign Application Priority Data

Jun. 6, 2000 (IT) .......................................... TO00A0543

(51) Int. Cl.[7] .............................................. H01L 31/119
(52) U.S. Cl. ........................ 257/391; 257/390; 257/392
(58) Field of Search ................................. 257/390, 391, 257/392

(56) References Cited

U.S. PATENT DOCUMENTS 5,650,956 A * 7/1997 Choi et al. .................. 365/104
6,084,275 A * 7/2000 Wu .............................. 257/390

* cited by examiner

Primary Examiner—Ngân V. Ngô
(74) Attorney, Agent, or Firm—Lisa K. Jorgenson; Robert Iannucci; Seed IP Law Group PLLC

(57) ABSTRACT

The ROM memory cell, not decodable by visual inspection comprises a substrate of semiconductor material having a first conductivity type, in particular P⁻. A first MOS device having a first threshold voltage is formed in a first portion of the substrate, and a MOS device having a second threshold voltage, greater than the first threshold voltage, is formed in a second portion of the substrate adjacent to the first portion. The second MOS device is a diode reverse biased during a reading phase of the ROM memory cell and comprises a source region having the first conductivity type and a drain region having a second conductivity type. The source region has a level of doping higher than that of the substrate.

7 Claims, 3 Drawing Sheets

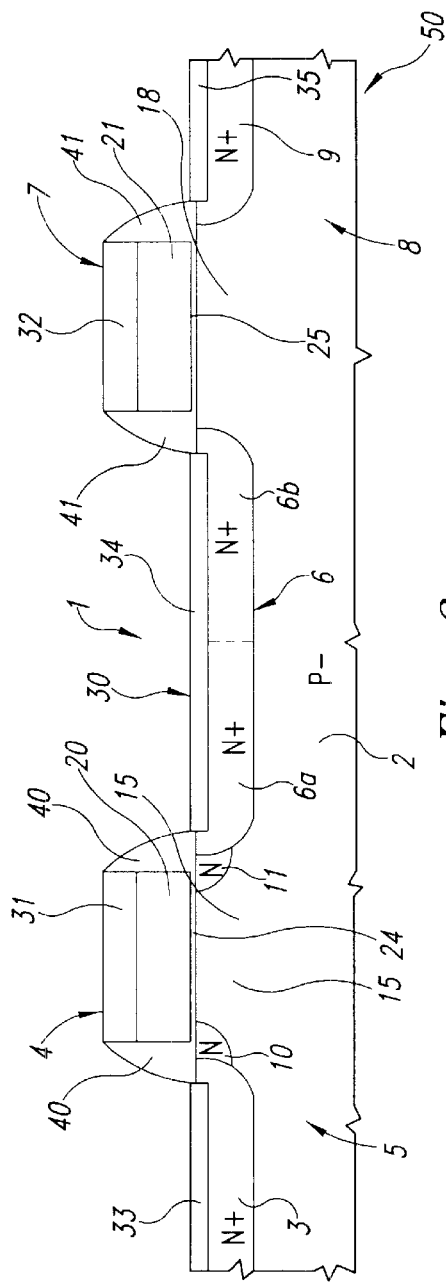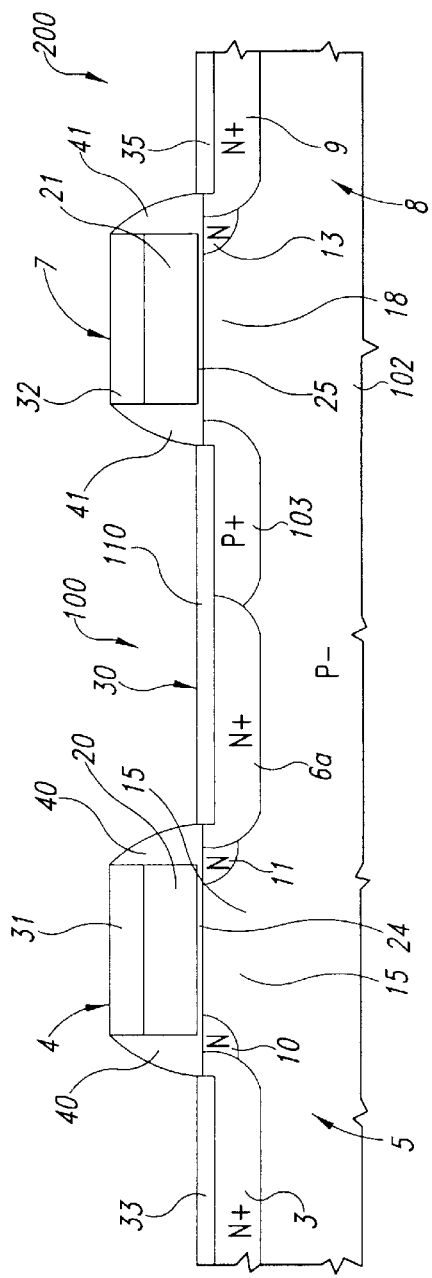

ROM MEMORY CELL NOT DECODABLE BY VISUAL INSPECTION

TECHNICAL FIELD

The present invention relates to a ROM memory cell not decodable by visual inspection.

BACKGROUND OF THE INVENTION

As is known, ROM memory cells not decodable by visual inspection are used inside smart devices, such as smart cards, to store confidential data (for example personal identification codes to be used in bank transactions or with SIM cards).

ROM memory cells not decodable by visual inspection are also used to store suitable algorithms which can encrypt confidential data.

In both cases, to make the data contained in the ROM memory cells difficult to interpret externally, it is necessary to provide the cells with a protective screen, made from a dedicated metallization layer covering all of the ROM memory cells and not having any other function.

In general, in CMOS integration processes, the ROM memory cells are represented by NMOS transistors having two different values of the threshold voltage $V_{th}$ (for example $V_{th}$=0.7 V and $V_{th}$=5.0 V).

Reading of the ROM memory cell content is carried out by feeding the NMOS transistors with a drain-source voltage $V_{DS}$ of approximately 1.0 V and a gatesource voltage $V_{GS}$ comprised between the two aforementioned threshold voltage values (for example the gate-source voltage $V_{GS}$ can have a value of approximately 2.5 V). The obtained drain-source current $I_{DS}$ is then compared with a reference current $I_{REF}$ which, for example, can have a value corresponding to the half-sum of the drain-source currents of an NMOS transistor with a high threshold ($V_{th}$=5.0 V), and of a NMOS transistor with a low threshold ($V_{th}$=0.7 V).

With reference to FIG. 1 showing the characteristic which associates the gate-source voltage $V_{GS}$ with the drain-source current $I_{DS}$ of an NMOS transistor, if the drain-source current $I_{DS}$ is greater than the reference current $I_{REF}$ (curve "R"), the NMOS transistor is at a logic state "1", corresponding to the switched on condition. On the other hand, if the drain-source current $I_{DS}$ is lower than the reference current $I_{REF}$, the NMOS transistor is at a logic state "0" corresponding to the switched off condition.

It is known that the ROM memory cells incorporated in the smart devices cannot be of the flash EEPROM or EPROM type since both can have problems of retention of the charge stored, which, over a period of time, can lead to loss of the data stored. It is therefore necessary to use alternative approaches. For this purpose, the NMOS transistor representing the logic state "1" (low-threshold transistor) is generally carried out such that it is altogether similar to standard NMOS transistors present in the smart device, whereas the NMOSFET transistor representing the logic state "0" (high-threshold transistor) is carried out using two alternative approaches.

For this purpose, FIG. 2 shows a transverse cross-section of a first embodiment of a ROM memory cell 1 incorporated in a smart device 50 and comprising a semiconductor material substrate 2 with P⁻-type conductivity.

The ROM memory cell 1 includes a first low-threshold transistor 4 and a second high-threshold transistor 7. The first transistor 4 is formed by a first conductive region 3, of type N⁺, defining a drain region, and by a first source region 6a, of type N⁺, both formed in a first portion 5 of the substrate 2. The second transistor 7 is formed by a second source region 6b, of type N⁺, providing in a second portion 8 of the substrate 2 adjacent to the first portion 5 and joined to the first source region 6a such as to form a second conductive region 6, and by a third conductive region 9, of type N⁺, defining a drain region of the second transistor 7.

The ROM memory cell 1 additionally comprises first and second extension regions 10, 11, of type N, operating respectively as a drain extension region and a source extension region of the first transistor 4, and third and fourth extension regions 12, 13 of type N operating respectively as a source extension region and a drain extension region of the second transistor 7.

The first and second extension regions 10, 11 extend laterally and in a position adjacent respectively to the first and second conductive regions 3, 6, and face one another. The first and second extension regions 10, 11, delimit a portion of substrate 2 forming a first channel region 15. Similarly, the third and fourth extension regions 12, 13 extend laterally and in a position adjacent respectively to the second and third conductive regions 6, 9, and face one another. The third and fourth extension regions 12, 13 delimit a portion of substrate 2 forming a second channel region 18.

The second channel region 18 accommodates an implanted region 19, which is more doped than the substrate 2, to increase the threshold voltage of the second transistor 7.

Above the first channel region 15, there is formed a first gate region 20 of polycrystalline silicon of the first transistor 4. Similarly, above the second channel region 18, there is formed a second gate region 21 of polycrystalline silicon of the second transistor 7. The first gate region 20 is isolated from the first channel region 15 by means of a first gate oxide layer 24, whereas the second gate region 21 is isolated from the second channel region 18 by means of a second gate oxide layer 25. Above the first and second gate regions 20, 21, and above the first, second and third conductive regions 3, 6, 9, there are present a first gate contact region 31, a second gate contact region 32, a first drain contact region 33, a common source contact region 34, and a second drain contact region 35 of a metal silicide, for example titanium. The first gate region 20 and the first gate contact region 31 are laterally adjoined by first oxide spacers 40. Similarly, the second gate region 21 and the second gate contact region 32 are laterally adjoined by second oxide spacers 41.

This first embodiment of the ROM memory cell 1 has the disadvantage that it is relatively costly to carry out, since it is necessary to add to the process phases commonly used additional phases of photolithography and implantation for defining the implanted region 19.

FIG. 3 shows a cross-section of a second embodiment of the ROM memory cell 1, in which parts corresponding to the first embodiment in FIG. 2 have been provided with the same reference numbers. In the second embodiment, the formation of the implanted region 19 and of the third and fourth extension regions 12, 13 is not provided.

In particular, the lack of definition of the third and fourth extension regions 12, 13 means that the second gate region 21 is not fully superimposed on the second channel region 18, which also extends partially below the second oxide spacers 41. In these design conditions, the application of a gate-source voltage $V_{GS}$ to the second transistor 7 is not sufficient to take the latter into a condition of conduction, i.e., to form a continuous reversal region between the second source region 6b and its drain region 9. This is owing to the fact that the portions of the second channel region 18 which are below the second spacers 41 cannot reverse their conductivity (from N to P), in the short period of time in which ROM memory cell 1 reading takes place.

Although this second embodiment of the ROM memory cell 1 has reduced manufacturing costs, since it does not require the operations of photolithography and implantation dedicated to the formation of the implanted region 19, it nevertheless has the disadvantage that it is difficult to control, since its satisfactory functioning depends on the dimensions of the oxide spacers 41.

SUMMARY OF THE INVENTION

The technical problem of the present invention is to provide a ROM memory cell not decodable by visual inspection.

According to one embodiment of the invention, the ROM memory cell comprises a substrate of semiconductor material having a first conductivity type, in particular $P^-$. A first MOS device having a first threshold voltage is formed in a first portion of the substrate, and a MOS device having a second threshold voltage, greater than the first threshold voltage, is formed in a second portion of the substrate adjacent to the first portion. The second MOS device is a diode, reverse biased during a reading phase of the ROM memory cell and includes an anode region having the first conductivity type and a cathode region having a second conductivity type. The anode region has a level of doping higher than that of the substrate.

BRIEF DESCRIPTION OF THE DRAWINGS

The characteristics and advantages of the ROM memory cell according to the invention will become apparent from the following description of an embodiment provided purely by way of non-limiting example with reference to the attached drawings, wherein

FIG. 3 shows a second embodiment of a known ROM memory cell;

FIG. 4 shows a first embodiment of a ROM memory cell according to the invention.

DETAILED DESCRIPTION OF THE INVENTION

FIG. 4 shows a ROM memory cell 100, which is included in a smart device 200, comprising a substrate 102 of semiconductor material, which has conductivity of type $P^-$.

Figure 1:
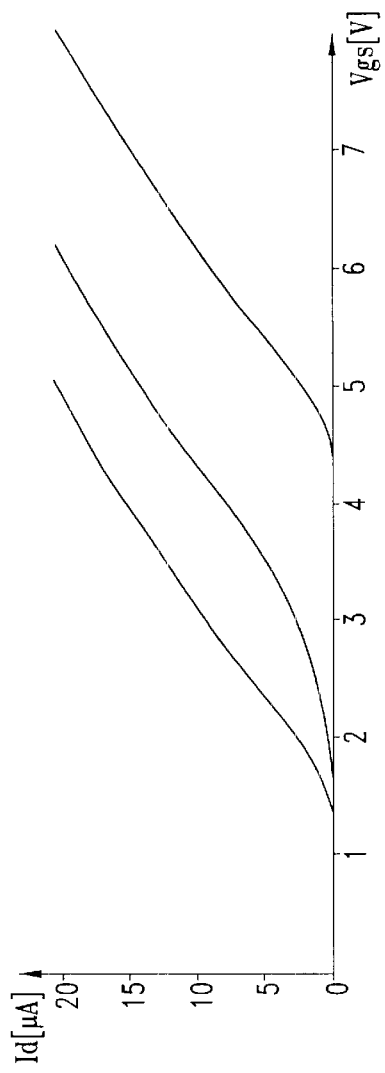
FIG. 1 shows the current-voltage characteristics used for evaluation of the electrical state of an NMOSFET transistor.
Figure 2:
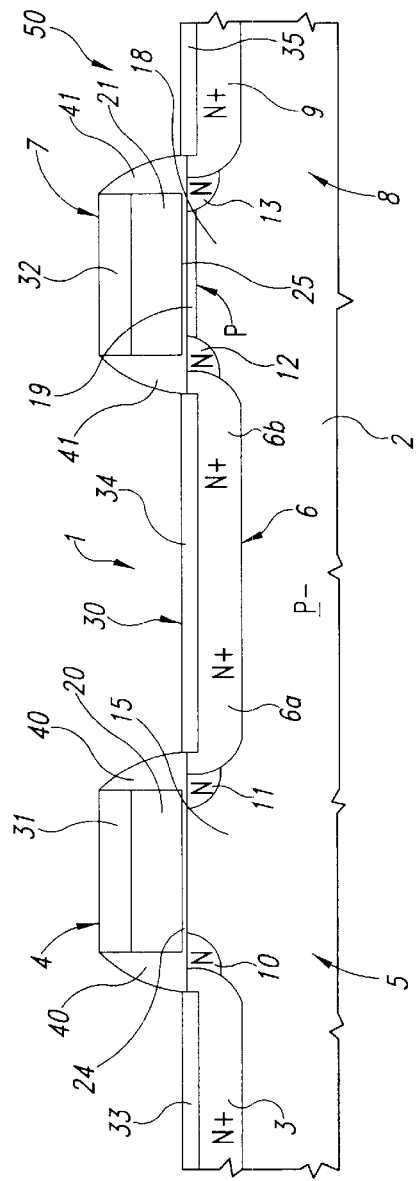
FIG. 2 shows a first embodiment of a known ROM memory cell.

In greater detail, the memory cell 100 is similar to the ROM memory cell 1 in FIG. 2, except for the fact that the second source region 6b and third extension region 12 are replaced by an active region 103, which has the same type of conductivity as the substrate 102 and in particular of type $P^+$.

Otherwise, the other parts of the ROM memory cell 100 are the same as those of the known ROM memory cell 1 in FIG. 2; they are therefore provided with the same reference numbers as those previously used, and will not be described again.

In the above-described conditions, the second transistor 7 operates as a diode having an anode region defined by the active region 103, and a cathode region defined by the third conductive region 9 and by the fourth extension region 13.

The presence of the metal silicide also permits easy connection between the first source region 6a and the active region 103, thus defining a common contact region 110.

Figure 5:
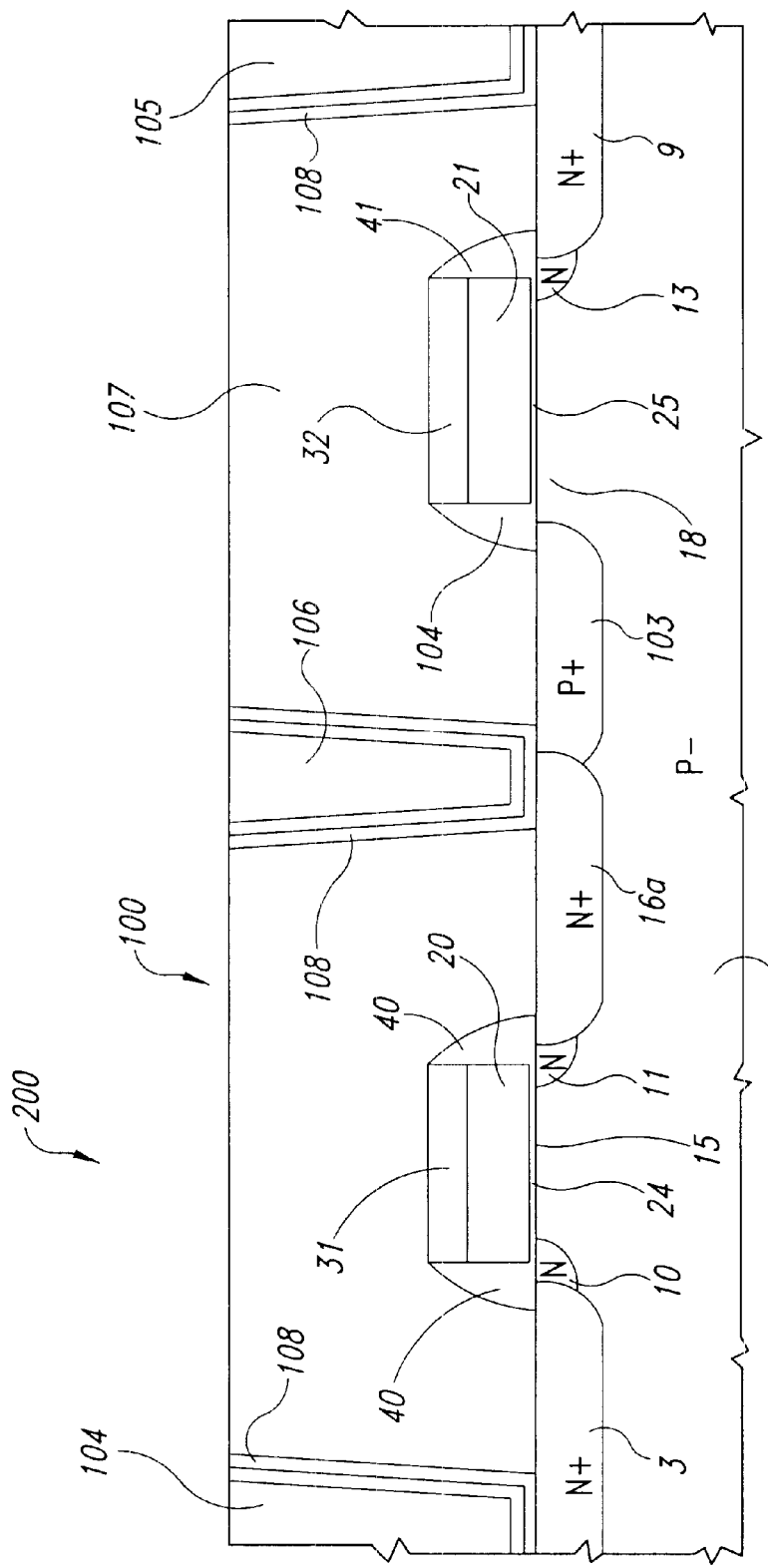
FIG. 5 shows a second embodiment of a ROM memory cell according to the invention.

If the ROM memory cell 100 manufacturing process does not include the use of the metal silicide, the definition of the contacts of the ROM memory cell takes place by forming connection regions 104, 105, 106 inside an isolating layer 107 of BPSG (Boron Phosphorous Silicon Glass) previously deposited on the surface of the ROM memory cell, as shown in FIG. 5. The connection regions 104, 105 extend in the isolating layer 107 until they contact the conductive regions 3, 9 respectively, whereas the connection region 106 extends in the isolating layer 107 until it contacts the first source region 6a and the active region 103, short-circuiting the latter. The connection regions 104, 105, 106 have walls 108 which are covered by a double layer of titanium/titanium nitride, and are filled with conductive material, typically tungsten.

In this case, the first and the second gate contact regions 31, 32 are tungsten silicide.

During the ROM memory cell 100 reading phase, the diode is reverse biased. In addition, the application of a reading voltage between the second gate region 21 and the active region 103 is not sufficient to form a continuous reversal region between the anode region and the cathode region of the diode in the brief period of time in which the ROM memory cell 100 is being read, and nor is it sufficient in stationary conditions.

The advantages of the ROM memory cell described are as follows.

Firstly, the ROM memory cell according to the invention has manufacturing costs which are relatively low, since additional process phases are not involved. In fact, the active region 103 is formed together with the regions of type P contained in the PMOSFET transistors present inside the smart device.

In addition, the ROM memory cell, according to the invention has a high level of reliability since, unlike the ROM memory cell shown in FIG. 3, its satisfactory functioning is not dependent on the dimensions of the oxide spacers.

In addition, the present ROM memory cell is not decodable by simple visual inspection since, in addition to the presence of a protective screen of the conventional type, the presence of regions of type P, instead of type N, in the high-threshold transistors, cannot be identified without sectioning the cell.

Finally, it is apparent that modifications and variants can be made to the ROM memory cell described, without departing from the context of the present invention.

What is claimed is:

1. A ROM memory cell not decodable by visual inspection, comprising:

a semiconductor material substrate having a first conductivity type;

a first MOS device formed in a first portion of the substrate and having a first threshold voltage; and a second MOS device formed in a second portion of said substrate, adjacent to said first portion, and having a second threshold voltage greater than the first threshold voltage, wherein said second MOS device is a diode, reverse biased during a ROM memory cell reading phase.

2. A cell according to claim 1, wherein said second MOS device comprises a first active region having said first conductivity type and a second active region having a second conductivity type.

3. A cell according to claim 2, wherein said first active region has a level of doping higher than that of said substrate.

4. A cell according to claim 2, wherein said first active region is a source region of said second MOS device and said second active region is a drain region of said second MOS device.

5. A cell according to claim 2, wherein said first conductivity type is P and said second conductivity type is N.

6. A cell according claim 2, wherein said first active region is connected to a conductive region of said second conductivity type and belonging to said first MOS device by means of a common metallization layer.

7. A cell according to claim 2, wherein said first active region is connected to a conductive region of said second type of conductivity and belonging to said first MOS device by means of a connection region extending in a aperture of a isolation layerformed above said ROM memory cell.

* * * * *